United States Patent
Lin

(10) Patent No.: US 8,717,083 B2
(45) Date of Patent: May 6, 2014

(54) LIMITING AMPLIFIER AND METHOD THEREOF

(71) Applicant: Realtek Semiconductor Corp., Hsinchu (TW)

(72) Inventor: Chia-Liang Lin, Fremont, CA (US)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 13/803,099

(22) Filed: Mar. 14, 2013

(65) Prior Publication Data

US 2013/0194040 A1 Aug. 1, 2013

Related U.S. Application Data

(62) Division of application No. 13/244,626, filed on Sep. 25, 2011, now Pat. No. 8,456,215.

(51) Int. Cl.
*H03L 5/00* (2006.01)

(52) U.S. Cl.
USPC ............... 327/307; 327/54; 327/67; 330/256; 330/259; 330/85; 330/98

(58) Field of Classification Search
USPC .................. 327/307, 52, 53, 54, 65, 66, 67; 330/258, 253, 259, 260, 288, 290, 293, 330/85, 98
See application file for complete search history.

(56) References Cited

U.S. PATENT DOCUMENTS

| | | | |
|---|---|---|---|
| 6,208,205 B1 | 3/2001 | Main et al. | |
| 6,288,604 B1 | 9/2001 | Shih et al. | |
| 6,750,702 B2 | 6/2004 | Massei | |
| 6,784,749 B1 | 8/2004 | Cove | |
| 6,917,233 B1 | 7/2005 | Waffaoui | |
| 7,265,620 B2 | 9/2007 | Liu et al. | |
| 7,355,471 B2 | 4/2008 | Chen et al. | |
| 7,535,295 B1 | 5/2009 | Huijsing et al. | |
| 7,948,309 B2 * | 5/2011 | Mak et al. | 330/98 |
| 2012/0126896 A1 | 5/2012 | Narayan et al. | |

* cited by examiner

*Primary Examiner* — Lincoln Donovan
*Assistant Examiner* — Jung H Kim
(74) *Attorney, Agent, or Firm* — McClure, Qualey & Rodack, LLP

(57) ABSTRACT

A method including receiving an input signal; amplifying the input signal to generate an output signal using a cascade of a plurality of amplifier stages including a first amplifier stage and a last amplifier stage; generating a voltage signal by sensing the output signal in a noninvasive manner so that the sensing results in substantially no change to the output signal; generating a current signal from the voltage signal using a transconductance amplifier; and injecting the current signal into an output node of the first amplifier stage in a noninvasive manner so that the injecting results in substantially no change to an amplification function of the first amplifier stage.

18 Claims, 3 Drawing Sheets

LIMITING AMPLIFIER AND METHOD THEREOF

CROSS-REFERENCE TO RELATED APPLICATION

This application is a Divisional of patent application Ser. No. 13/244,626, filed Sep. 25, 2011, now issued as U.S. Pat. No. 8,456,215, the subject matter of which is incorporated herein by reference.

FIELD OF TECHNOLOGY

This disclosure relates generally to methods and apparatus of limiting amplifiers.

BACKGROUND

As is known, limiting amplifiers are widely used in optical communications. A limiting amplifier receives an input signal presenting a stream of binary data, amplifies the input signal into saturation with a high gain and outputs a substantially two-level output signal exhibiting the binary data. Limiting amplifiers preferably have a high gain so that they can amplify the input signal into saturation. At the same time, a limiting amplifier should have a sufficient speed to keep up with a rapid change in the input signal. In addition, as is common in many high-gain amplifiers, an offset at an input of a limiting amplifier needs to be properly handled; otherwise the offset may be amplified to an extent that the offset saturates a latter stage of the limiting amplifier regardless of the input signal.

A conventional limiting amplifier 100 is depicted in FIG. 1. Limiting amplifier 100 comprises seven amplifier stages 110-170, each receiving power from a power supply node $V_{DD}$ and grounded to a ground node $V_{SS}$, for receiving a differential input signal comprising two ends $V_{i+}$ and $V_{i-}$ (hereafter $V_{i+}/V_{i-}$) and outputting a differential output signal comprising two ends $V_{o+}$ and $V_{o-}$ (hereafter $V_{o+}/V_{o-}$). Limiting amplifier 100 further comprises a low pass filter (LPF) 190 for receiving the output signal $V_{o+}/V_{o-}$ and outputting a differential filtered signal comprising two ends $V_{f+}$ and $V_{f-}$ (hereafter $V_{f+}/V_{f-}$), and a feedback amplifier 180 for receiving the differential filtered signal $V_{f+}/V_{f-}$ and outputting a differential signal into two common nodes 111 and 112 that are shared with a first amplifier stage 110. The seven amplifier stages 110-170 provide a high gain to the differential input signal $V_{i+}/V_{i-}$. However, there might be an offset at the input of first amplifier stage 110 that is also amplified by the high gain. LPF 190 comprises a pair of R-C network (191-192 and 193-194) to extract a low frequency component of the differential output signal $V_{o+}/V_{o-}$ that primarily originates from the offset.

As a result, the differential filtered signal $V_{f+}/V_{f-}$ is basically an unwanted component of the output differential signal $V_{o+}/V_{o-}$. Feedback amplifier 180 receives the differential filtered signal $V_{f+}/V_{f-}$, amplifies the differential filtered signal $V_{f+}/V_{f-}$, and transmits the amplified output into the two nodes 111 and 112 with a polarity reversal. A negative feedback loop comprising amplifier stages 120-170, LPF 190, and feedback amplifier 180, is thus formed. Due to LPF 190, the negative feedback is effective only for the low frequency component of the differential output signal $V_{o+}/V_{o-}$ that primarily originates from the offset at the input of the limiting amplifier 100. Due to the high gain nature of the negative feedback loop, the unwanted offset is effectively suppressed. The feedback amplifier 180, however, increases loading at circuit nodes 111 and 112, suppresses the amplification function of the first amplifier stage 110, and slows down the overall speed of limiting amplifier 100.

What is desired is a limiting amplifier that utilizes a feedback scheme that does not slow down the overall speed of the limiting amplifier.

SUMMARY

In one embodiment, an apparatus comprises a plurality of amplifier stages including a first amplifier stage and a last amplifier stage configured in a cascade arrangement, and a transconductance amplifier, wherein: the first amplifier stage is configured to receive an input signal; the last amplifier stage is configured to output an output signal; the transconductance amplifier is configured to receive a voltage signal from the last amplifier stage via a first resistor, and the transconductance amplifier is configured to output a current signal to an output node of the first amplifier stage via a second resistor in a negative feedback manner. A resistance of the first resistor is substantially greater than an output impedance of the last amplifier stage. A resistance of the second resistor is substantially greater than an output impedance of the first amplifier stage. The first amplifier stage is configured to receive power from a first power supply node. The transconductance amplifier is configured to receive power from a second power supply node. In an embodiment, a voltage potential of the second power supply node is higher than that of the first power supply node.

In a second embodiment, a method comprises: receiving an input signal; amplifying the input signal to generate an output signal using a cascade of a plurality of amplifier stages including a first amplifier stage and a last amplifier stage; generating a voltage signal by sensing the output signal in a noninvasive manner so that the sensing results in substantially no change to the output signal; generating a current signal from the voltage signal using a transconductance amplifier; and injecting the current signal into an output node of the first amplifier stage in a noninvasive manner so that the injecting results in substantially no change to an amplification function of the first amplifier stage. In an embodiment, sensing the output signal comprises coupling to the output signal via a resistor of resistance substantially greater than an output impedance of the last amplifier stage. In an embodiment, injecting the current signal comprises coupling to the output node of the first amplifier stage via a resistor of resistance substantially greater than an output impedance of the first amplifier stage.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
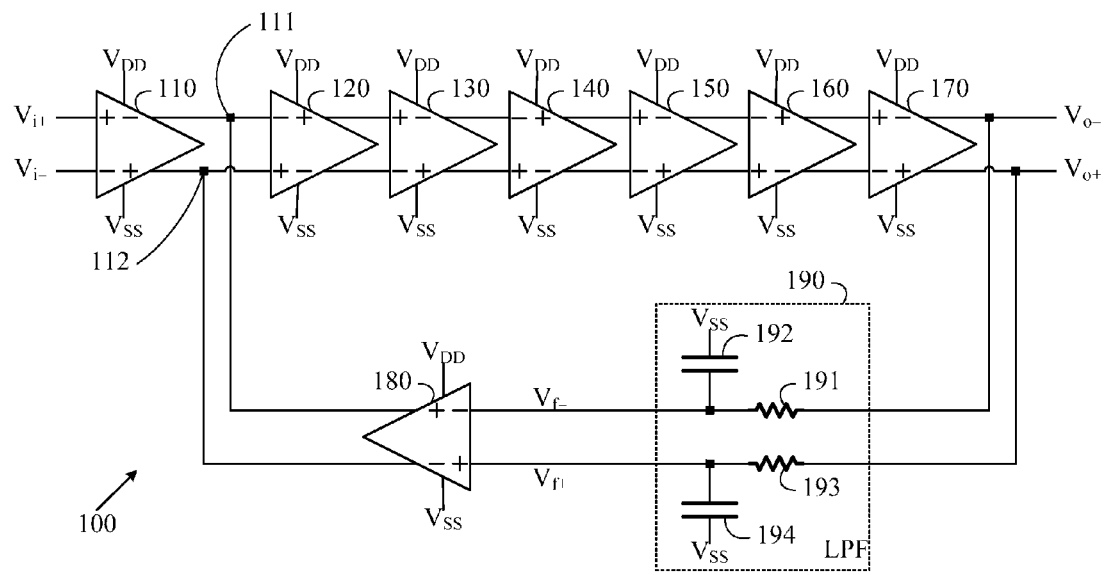
FIG. 1 shows a schematic diagram of a conventional limiting amplifier.
Figure 2:
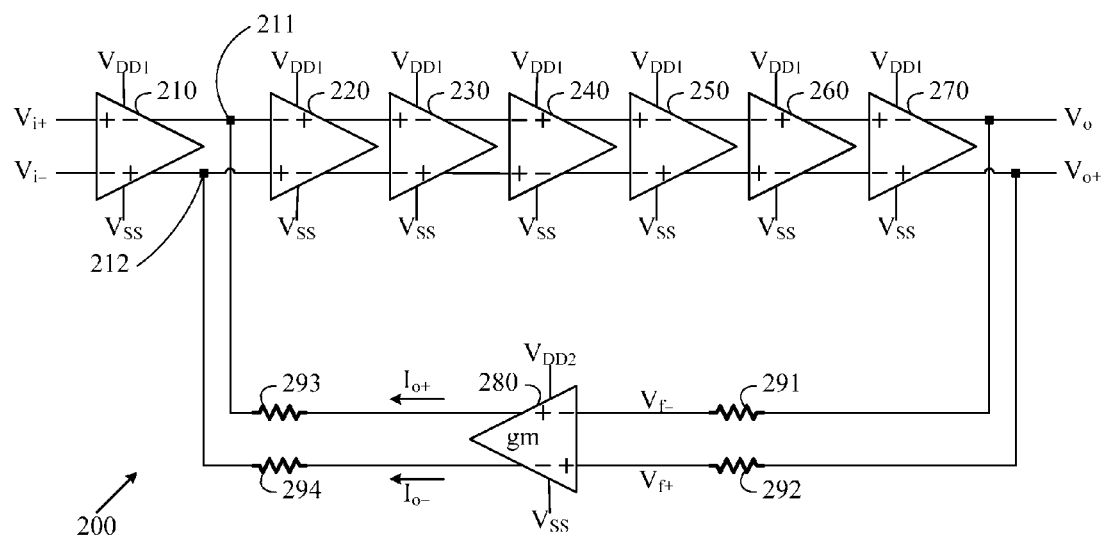
FIG. 2 shows a schematic diagram of a limiting amplifier in accordance with an embodiment of the present invention.

A limiting amplifier 200 in accordance with an embodiment of the present invention is depicted in FIG. 2. Limiting amplifier 200 includes a plurality of amplifier stages, for examples, seven amplifier stages 210-270, each receiving power from a first power supply node $V_{DD1}$ and grounded to a ground node $V_{SS}$, for receiving a differential input signal comprising two ends $V_{i+}$ and $V_{i-}$ (hereafter $V_{i+}/V_{i-}$) and outputting a differential output signal comprising two ends $V_{o+}$ and $V_{o-}$ (hereafter $V_{o+}/V_{o-}$). Limiting amplifier 200 further comprises a transconductance amplifier 280, a first resistor pair 291-292, and a second resistor pair 293-294. An input of transconductance amplifier 280 is coupled to the differential output signal $V_{o+}/V_{o-}$ via the first resistor pair 291-292, resulting in a differential intermediate voltage signal comprising two ends $V_{f+}$ and $V_{f-}$ (hereafter $V_{f+}/V_{f-}$). Transconductance amplifier 280 amplifies the differential intermediate voltage signal $V_{f+}/V_{f-}$ into a differential current signal comprising two branches $I_{o+}$ and $I_{o-}$ (hereafter $I_{o+}/I_{o-}$). The differential current signal $I_{o+}/I_{o-}$ is injected into circuit nodes 211 and 212 via the second resistor pair 293-294. Circuit nodes 211 and 212 are output nodes of the first amplifier stage 210. Transconductance amplifier 280 receives power from a second power supply node $V_{DD2}$ and is grounded to the ground node $V_{SS}$.

In an embodiment, the second power supply node $V_{DD2}$ has a higher potential than the first power supply node $V_{DD1}$. Transconductance amplifier 280 has a bandwidth that is substantially narrower than a bandwidth of the input differential signal $V_{i+}/V_{i-}$. The seven amplifier stages 210-270 provide a high gain to the differential input signal $V_{i+}/V_{i-}$. However, there might be an offset at the input of the limiting amplifier 200 that is also amplified by the high gain, resulting in an unwanted component in the differential outputs signal $V_{o+}/V_{o-}$.

Transconductance amplifier 280 indirectly receives the differential outputs signal $V_{o+}/V_{o-}$ via the first resistor pair 291-292. The purpose of the first resistor pair 291-292 is to provide isolation between an output of the last amplifier stage 270 and the input of the transconductance amplifier 280 so that the transconductance amplifier 280 does not present a heavy load to the last amplifier stage 270, lest it may slow down the last amplifier stage 270. A resistance of the first resistor pair 291-292 must be substantially higher than an output impedance of the last amplifier stage 270 to fulfill the purpose of isolation. Since the bandwidth of transconductance amplifier 280 is substantially narrower than the bandwidth of the input differential signal $V_{i+}/V_{i-}$, transconductance amplifier 280 is effectively extracting a low frequency component of the differential output signal $V_{o+}/V_{o-}$ that is unwanted and primarily originates from an offset at the input of the limiting amplifier 200. Transconductance amplifier 280 converts the low frequency component into current signal $I_{o+}/I_{o-}$ that is injected to circuit nodes 211 and 212 via the second resistor pair 293-294, resulting in a negative feedback for the unwanted low frequency component. As a result, the unwanted low frequency component is effectively suppressed by a negative feedback loop comprising amplifier stages 220-270, the first resistor pair 291-292, the transconductance amplifier 280, and the second resistor pair 293-294. The purpose of the second resistor pair 293-294 is to a provide isolation between an output of the transconductance amplifier 280 and the circuit nodes 211 and 212 to prevent slow down of the first amplifier stage 210 due to the transconductance amplifier 280. To provide sufficient isolation, a resistance of the second resistor pair 293-294 needs to be sufficiently large; this may lead to a large voltage drop across the second resistor pair 293-294. The second power supply node $V_{DD2}$ has a higher potential than the first power supply node $V_{DD1}$ so as to ensure sufficient headroom for the current signal $I_{o+}/I_{o-}$ in spite of the large voltage drop across the second resistor pair 293-294 due to a large value of the second resistor pair 293-294.

Figure 3:
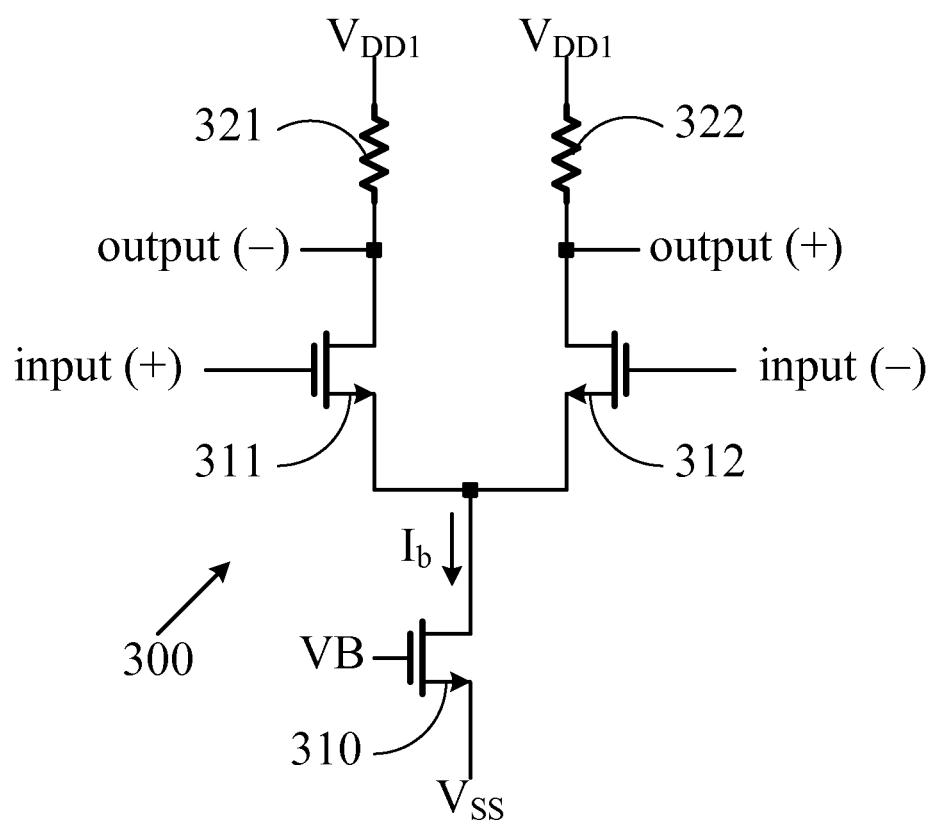
FIG. 3 shows a schematic diagram of an amplifier stage.

An amplifier 300 suitable for embodying any one of the seven amplifier stages 210-270 of FIG. 2 is depicted in FIG. 3. Amplifier 300 receives a differential input (comprising a "+" and a "−" end) and outputs a differential output (comprising a "+" and a "−" end). Amplifier 300 includes a differential pair having two NMOS (n-type metal-oxide semiconductor field effect transistors) 311 and 312 biased by a biasing current $I_b$ from a current source embodied by a NMOS 310 receiving a biasing voltage VB at a gate terminal; and a resistor pair 321-322 serving as a load to the differential pair and also a path for receiving the power from the first power supply node $V_{DD1}$. Amplifier 300 is a typical amplifier well known in prior art and thus no detailed description on how it works is given here.

Figure 4:
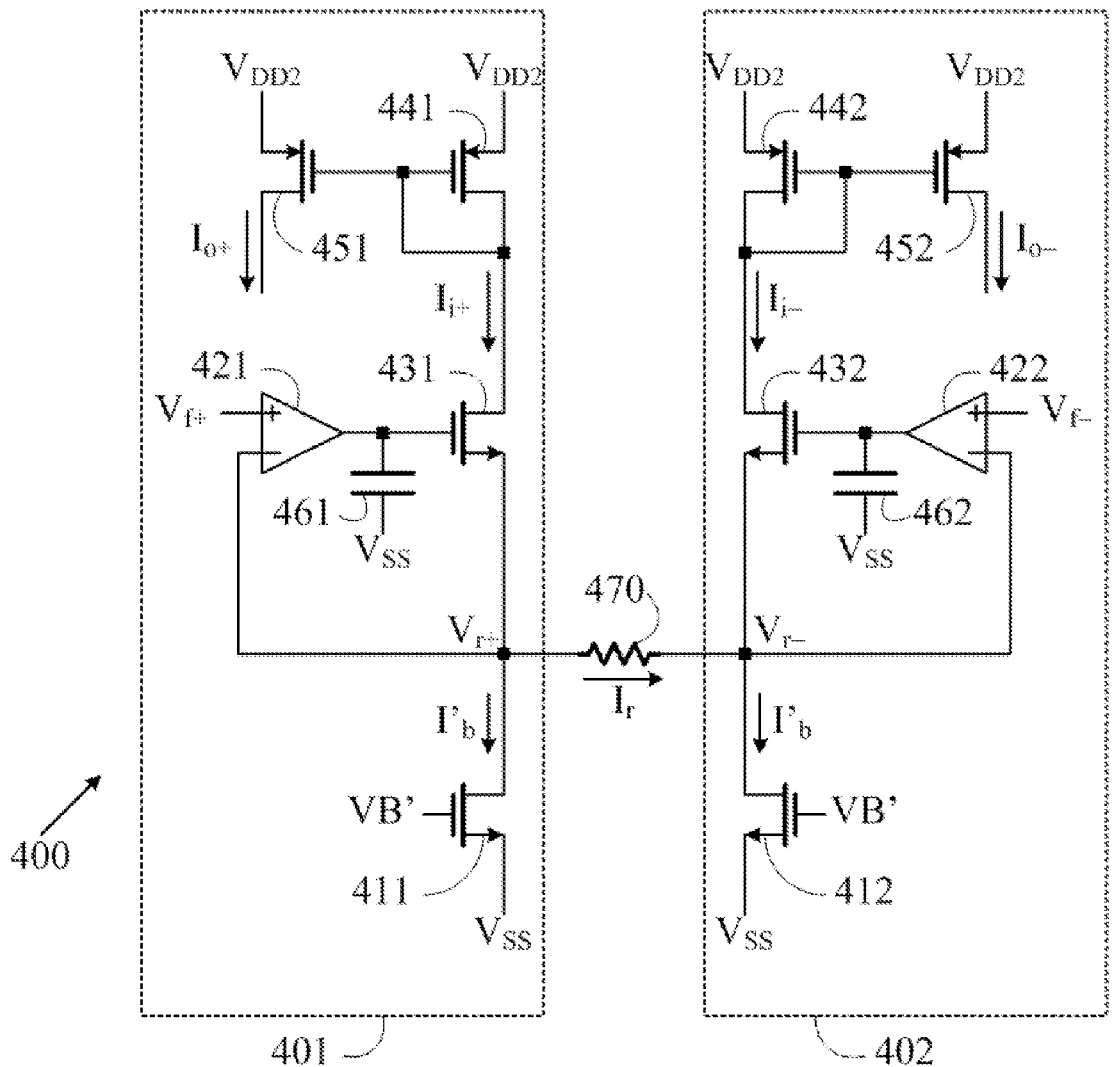
FIG. 4 shows a schematic diagram of a transconductance amplifier.

A transconductance amplifier 400 suitable for embodying the transconductance amplifier 280 of FIG. 2 is depicted in FIG. 4. Transconductance amplifier 400 includes two halves of identical circuits 401 and 402. Half circuit 401 receives $V_{f+}$, generates an intermediate voltage $V_{r+}$, and outputs $I_{o+}$; half circuit 402 receives $V_{f-}$, generates an intermediate voltage $V_{r-}$, and outputs $I_{o-}$. Half circuit 401 comprises a voltage follower comprising an operational amplifier 421 and a source follower comprising NMOS 431, configured in a negative feedback configuration. The operational amplifier 421 has sufficiently large gain and therefore intermediate voltage $V_{r+}$ will effectively follow $V_{f+}$, due to the negative feedback that forces the "−" terminal voltage to track the "+" terminal voltage of the operational amplifier 421. A capacitor 461 is used to provide frequency compensation for the voltage follower to ensure stability of the feedback loop. Capacitor 461 also fulfills low-pass filtering function that limits the bandwidth of the voltage follower. Half circuit 401 further includes a current source embodied by NMOS 411 biased by a biasing voltage VB' for providing a constant current $I'_b$ to the circuit node of $V_{r+}$; and a current mirror, having PMOS (p-type metal-oxide semiconductor field effect transistor) 441 configured in a diode-connected configuration and PMOS 451 configured in a common source configuration, for receiving an intermediate current $I_{i+}$ from a drain terminal of NMOS 431 and mirroring $I_{i+}$ into the output current $I_{o+}$. Half circuit 402 is identical to half circuit 401 and thus is not described in detail here. Half circuit 401 is coupled to half circuit 402 via a degeneration resistor 470 inserted between the two circuit nodes for $V_{r+}$ and $V_{r-}$. For a low frequency signal of interest, $V_{r+}$ effectively follows $V_{f+}$ and $V_{r-}$ effectively follows $V_{f-}$, resulting in a current $I_r$ flowing between $V_{r+}$ and $V_{r-}$ via the degeneration resistor 470, where $$I_r=(V_{r+}-V_{r-})/R \approx (V_{f+}-V_{f-})/R$$

Here, R denotes a resistance of the degeneration resistor 470.

Let the W/L (width to length) ratio of PMOS 451 be n times higher than that of PMOS 441. Then the current mirror formed by PMOS 441 and 451 provides a current gain of n. Then $I_{o+}$ can be approximated by the following equation:

$$I_{o+}=n \cdot I_{i+} \approx n \cdot [I'_b+(V_{f+}-V_{f-})/R]$$

Likewise, $I_{o-}$ can be approximated by the following equation:

$$I_{o-} = n \cdot I_{i-} \approx n \cdot [I'_b - (V_{f+} - V_{f-})/R]$$

The differential output current is $$I_{o+} - I_{o-} \approx 2n \cdot (V_{f+} - V_{f-})/R$$

The transconductance provided by the transconductance amplifier 400 is thus $$g_m = (I_{o+} - I_{o-})/(V_{f+} - V_{f-}) = 2n/R$$

The transconductance of transconductance amplifier 400, therefore, can be adjusted by changing a value for resistor 470 or change W/L ratio for PMOS 441 (along with PMOS 442, which is preferably identical to PMOS 441) or PMOS 451 (along with PMOS 452, which is identical to PMOS 451). The bandwidth of transconductance amplifier 400 can be adjusted by changing a value for capacitor 461 (and also capacitor 462, which is preferably identical to capacitor 461).

Embodiments of operational amplifiers are well known to those of ordinary skill in the art and thus not described in detail here.

Now refer back to FIG. 2. In embodiment 200 of FIG. 2, all seven amplifier stages 210-270 receive power from the first power supply node $V_{DD1}$. However, that is by way of example but not restriction. At the discretion of circuit designers, different number of stages may be used, and also different supply voltages may be used. The reason why transconductance amplifier 280 receives power from the second power supply node $V_{DD2}$ that has a higher potential than that of $V_{DD1}$ is to allow more headroom for the current signal $I_{O+}/I_{O-}$. For that purpose, transconductance amplifier 280 needs to have a supply voltage higher than that of the first amplifier stage 210, but not necessarily higher than that of any of the rest of the amplifier stages 220-270. Furthermore, if the headroom for the current signal $I_{O+}/I_{O-}$ is sufficient even if the transconductance amplifier 280 uses the same power supply as that of the first amplifier stage 210, then one may even choose to use the same power supply voltage for both the transconductance amplifier 280 and the first amplifier stage.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method comprising:
  receiving an input signal;
  amplifying the input signal to generate an output signal using a cascade of a plurality of amplifier stages including a first amplifier stage and a last amplifier stage;
  generating a voltage signal by sensing the output signal in a noninvasive manner so that the sensing results in substantially no change to the output signal;
  generating a current signal from the voltage signal using a transconductance amplifier; and
  injecting the current signal into an output node of the first amplifier stage in a noninvasive manner so that the injecting results in substantially no change to an amplification function of the first amplifier stage, wherein injecting the current signal into an output node of the first amplifier stage in a noninvasive manner comprises coupling to the output node of the first amplifier stage via a resistor of resistance substantially higher than an output impedance of the first amplifier stage.

2. The method of claim 1 further comprising: using a first supply voltage for the first amplifier stage and a second supply voltage for the transconductance amplifier.

3. The method of claim 2, wherein the second supply voltage is higher than the first supply voltage to allow more headroom for the current signal.

4. The method of claim 1, wherein sensing the output signal in a noninvasive manner comprises coupling to the output signal via a resistor of resistance substantially higher than an output impedance of the last amplifier stage.

5. The method of claim 1, wherein a bandwidth of the transconductance amplifier is substantially narrower than a bandwidth of the input signal.

6. The method of claim 5, wherein the transconductance amplifier comprises a capacitor and the bandwidth of the transconductance amplifier is determined by a capacitance of the capacitor.

7. The method of claim 1, wherein the transconductance amplifier comprises a voltage follower, a degeneration resistor, and a current mirror.

8. The method of claim 7, wherein a transconductance of the transconductance amplifier is substantially inversely proportional to a resistance of the degeneration resistor.

9. The method of claim 7, wherein a transconductance of the transconductance amplifier is substantially proportional to a gain of the current mirror.

10. A method comprising:
  receiving an input signal;
  inputting the input signal into a first stage of an amplifier;
  outputting an output signal from a last stage of the amplifier, wherein the first stage and the last stage are in a cascade configuration;
  generating a voltage signal from the output signal;
  using a transconductance amplifier to generate a current signal from the voltage signal;
  using a first supply voltage for the first amplifier stage and a second supply voltage for the transconductance amplifier, wherein the second supply voltage is higher than the first supply voltage; and
  injecting the current signal into an output node of the first amplifier stage without substantially impacting loading of the first amplifier stage.

11. The method of claim 10, wherein generating a voltage signal from the output signal comprises sensing the output signal in a noninvasive manner by coupling to the output signal via a resistor of resistance substantially higher than an output impedance of the last amplifier stage.

12. The method of claim 10, wherein injecting the current signal into an output node of the first amplifier stage comprises coupling to the output node of the first amplifier stage via a resistor of resistance substantially higher than an output impedance of the first amplifier stage so that the coupling is substantially non-invasive.

13. The method of claim 10, wherein a bandwidth of the transconductance amplifier is substantially narrower than a bandwidth of the input signal.

14. The method of claim 13, wherein the transconductance amplifier comprises a capacitor and the bandwidth of the transconductance amplifier is determined by a capacitance of the capacitor.

15. The method of claim 10, wherein the transconductance amplifier comprises a voltage follower, a degeneration resistor, and a current mirror.

16. The method of claim 15, wherein a transconductance of the transconductance amplifier is substantially inversely proportional to a resistance of the degeneration resistor.

17. The method of claim 15, wherein a transconductance of the transconductance amplifier is substantially proportional to a gain of the current mirror.

18. A method comprising:
receiving an input signal;
amplifying the input signal to generate an output signal using a cascade of a plurality of amplifier stages including a first amplifier stage and a last amplifier stage;
generating a voltage signal by sensing the output signal in a noninvasive manner so that the sensing results in substantially no change to the output signal;
generating a current signal from the voltage signal using a transconductance amplifier, wherein the transconductance amplifier comprises a voltage follower, a degeneration resistor, and a current mirror, wherein a transconductance of the transconductance amplifier is substantially inversely proportional to a resistance of the degeneration resistor; and
injecting the current signal into an output node of the first amplifier stage in a noninvasive manner so that the injecting results in substantially no change to an amplification function of the first amplifier stage.

* * * * *